United States Patent
Kwon et al.

(10) Patent No.: US 6,490,206 B2
(45) Date of Patent: Dec. 3, 2002

(54) HIGH-SPEED SYNCHRONOUS SEMICONDUCTOR MEMORY HAVING MULTI-STAGE PIPELINE STRUCTURE AND OPERATING METHOD

(75) Inventors: Kook-Hwan Kwon, Kyonggi-do (KR); Young-Ho Suh, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/957,821

(22) Filed: Sep. 20, 2001

(65) Prior Publication Data

US 2002/0048196 A1 Apr. 25, 2002

(30) Foreign Application Priority Data

Oct. 24, 2000 (KR) ........................................ 2000-62502

(51) Int. Cl.[7] .................................................. G11C 7/10
(52) U.S. Cl. .................. 365/189.05; 365/233; 365/196; 365/195; 365/203; 365/190; 365/230.08
(58) Field of Search ................................. 365/240, 239, 365/233, 189.05, 189.12, 205, 196, 195, 203, 190, 230.08

(56) References Cited

U.S. PATENT DOCUMENTS

| | | | | |
|---|---|---|---|---|
| 5,631,866 A | * | 5/1997 | Oka et al. | 365/189.05 |
| 5,666,324 A | * | 9/1997 | Kosugi et al. | 365/233 |
| 5,703,815 A | * | 12/1997 | Kuhara et al. | 365/194 |
| 5,872,742 A | | 2/1999 | Kengeri et al. | 365/233 |
| 5,892,723 A | * | 4/1999 | Tanaka et al. | 365/207 |
| 5,923,615 A | * | 7/1999 | Leach et al. | 365/238.5 |
| 5,963,483 A | * | 10/1999 | Yahata et al. | 365/189.05 |
| 6,064,600 A | * | 5/2000 | Manning | 365/189.02 |
| 6,064,624 A | * | 5/2000 | Pawlowski | 365/230.06 |
| 6,134,180 A | * | 10/2000 | Kim et al. | 365/233 |
| 6,154,417 A | * | 11/2000 | Kim | 365/233 |

FOREIGN PATENT DOCUMENTS

JP   64-21786   *   1/1989   ........... G11C/11/34

* cited by examiner

Primary Examiner—Andrew Q. Tran
(74) Attorney, Agent, or Firm—Marger Johnson & McCollom, PC

(57) ABSTRACT

In order to reduce a cycle time and enable a high-speed operation in a semiconductor memory, the memory is constructed having a multi-pipeline structure. The multi-pipeline structure, for instance, includes a three-stage pipeline, in which an additional data register is introduced between a sense amplifier and a main data line. The remaining memory structure can be configured in a manner comparable to that of a conventional two-stage pipeline semiconductor memory.

20 Claims, 8 Drawing Sheets

HIGH-SPEED SYNCHRONOUS SEMICONDUCTOR MEMORY HAVING MULTI-STAGE PIPELINE STRUCTURE AND OPERATING METHOD

This application claims priority from Korean Patent Application No. 2000-62502, filed Oct. 24, 2000, the contents of which are incorporated herein by reference in their entirety.

BACKGROUND OF THE INVENTION

1. Field of the Invention

The present invention relates to an integrated circuit of a semiconductor memory and more particularly to a synchronous pipeline semiconductor memory for high-speed operations.

2. Description of Related Art

As electronic systems in computer, communication, and other applications increase in capacity and operating speed, the semiconductor memories used therein must also increase in capacity and speed to meet the needs of the system. High-speed static random access memories (SRAMs), for instance, are an important cache memory for computers and communication applications. Because data processors operate at extremely high speeds, faster operating cache memories are desirable to provide improved system performance. Double data rate and pipelined burst methods have been disclosed as ways of increasing operating speeds to meet system demands.

FIGS. 1 and 2 are a block diagram and related timing flowchart, respectively, of a prior art synchronous semiconductor memory. The prior art system shown in FIGS. 1 and 2 is disclosed by Leach, et al, in U.S. Pat. No. 5,923,615 (Leach), issued Jul. 13, 1999. In Leach, a synchronous pipeline burst memory operates at a rapid clock speed without additional pipeline stages. The memory is constructed having an address input buffer 22, an address register 24, a synchronous control circuit 26, a data register 28, a data output buffer 30, and an asynchronous memory core 40. The address register 24 latches burst addresses during the first cycle, and the latched burst address is sent to an input of the asynchronous memory core 40, which includes a plurality of memory cells.

The output data sent out of the asynchronous memory core 40 is not latched until the third cycle. The third cycle is generated after the second cycle of a periodic clock signal, which in turn follows the first cycle. As a result, the burst operation cycles of Leach better guarantee sensing operations according to a typical pipeline rule by securing a longer time between the activation of word lines and the distinction of bit lines. Unfortunately, however, Leach fails to reduce the cycle time of the memory because the data output from a memory cell at the activation time of a latch signal from the synchronous control circuit 26 is not latched until the third cycle of the periodic clock signal. The cycle time of the Leach memory is therefore determined by the time taken from initiating an external clock signal to the latching of data at the data register. Errors in data latching and unstable sensing operations may occur if the operational cycle time is shorter than a pre-set time.

In the synchronous pipeline memory field, research is continuously being conducted on ways to obtain a shorter cycle time. Although conventional pipeline operations, such as those illustrated in FIG. 3, are well known in this field, they will be described generally in this application to provide a more thorough understanding of the various aspects and embodiments of the present invention.

FIG. 3 illustrates general read operation timing of a two-stage synchronous pipeline memory. Referring to FIG. 3, if an external address XADD is input during the first cycle T1 of an external clock signal XCLK, the address is decoded to the row and column selecting signals SWL, Yi, respectively, during the first cycle. The row and column selecting signals SWL, Yi are then transmitted to the memory cell array. The row and column selecting signals SWL, Yi operate to select a corresponding memory cell, such that the charge of the selected memory cell will be shared with corresponding shared data lines SDL, /SDL.

After the charge is shared with the data lines SDL, /SDL, a block sense amplifier BSA (or the first sense amplifier) begins its operations in response to the inputting of a sense amplifier enable signal PSAL. The block sense amplifier senses and amplifies a difference in the levels of voltage developed among the data lines SDL, /SDL and provides this amplified signal as cell data (or storage information) of the selected memory cell to the main data lines MDL, /MDL. More specifically, the cell data is latched through an output buffer, commonly connected to the main data lines MDL, /MDL, to a data register connected to the rear end of an output buffer.

The data register shifts the latched cell data to an output driver in response to the second clock signal, sent during the second cycle of the external clock signal XCLK. The cell data is driven by the output driver and then output to an external data input/output terminal I/O. In this circuit, the cycle time is determined as the time from the shift of an external clock signal to the latch of data to the data register. The clock to data speed is determined as the time from activation of the second clock signal Kdata to the external output of cell data latched at the data register through an output driver.

Therefore, this two-stage synchronous pipeline memory is limited in its ability to reduce the cycle time because it takes a long time for cell data to become latched to the data register. Accordingly, a need remains for an alternative memory structure and method that is capable of reducing the cycle time by shortening the time between the shifting of an external clock signal and the latching of data to the data register.

SUMMARY OF THE INVENTION

It is an object of the present invention to provide a semiconductor memory that has a reduced cycle time and a faster operating cycle.

It is another object of the present invention to provide a method for operating a semiconductor memory with a reduced cycle time.

It is a still another object of the present invention to provide a high speed synchronous semiconductor memory having a structure that reduces the time to latch data to a data register after the transmission of an external clock signal.

It is yet another object of the present invention to provide a method of operating a high-speed synchronous semiconductor memory with a reduced time for latching data to a data register following an external clock signal.

A semiconductor memory according to a preferred embodiment of this invention includes a three or more-stage pipeline. The semiconductor memory includes the basic structure of a two-stage pipeline and additionally includes a data register between a sense amplifier and a common data line.

A method for operating a semiconductor memory according to a preferred embodiment of the present invention proceeds by latching output data of a block sense amplifier to a first data register, connected with a front end of an output buffer, during the first clock cycle. The latched data is then latched to a second data register, connected with a rear end of the output buffer, during the second clock cycle. The data stored at the second data register is outputted externally through an output driver during the third clock cycle.

BRIEF DESCRIPTION OF THE DRAWINGS

A fuller understanding of the nature and objects of the invention can be obtained through the following detailed description of preferred embodiments, made with reference to the accompanying drawings, in which.

DETAILED DESCRIPTION OF PREFERRED EMBODIMENTS

Figure 4:
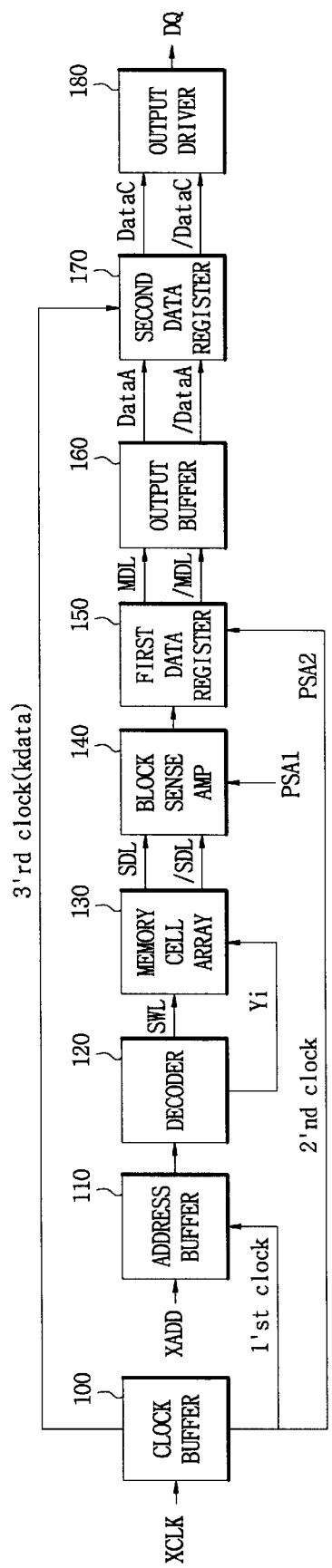
FIG. 4 is a block diagram illustrating a synchronous semiconductor memory constructed according to an embodiment of the present invention.

Referring to FIG. 4, a synchronous semiconductor memory constructed in accordance with a preferred embodiment of the present invention includes a clock buffer 100, an address buffer 110, a decoder 120, a memory cell array 130, a block sense amplifier 140, a first data register 150, an output buffer 160, a second data register 170, and an output driver 180.

The clock buffer 100 receives an external clock XCLK and generates the first, second, and third clocks. The address buffer 110 receives, buffers, and outputs an external address XADD in response to the first clock. The decoder 120 decodes row and column addresses output from the address buffer 110 and generates a row selecting signal SWL and a column selecting signal Yi. The memory cell array 130 includes a plurality of memory cells positioned at intersections between pairs of word lines and bit lines. The charge stored in a memory cell selected by enabling the row selecting signal SWL and the column selecting signal Yi is shared with the shared (or common) data lines SDL, /SDL.

The block sense amplifier 140 senses and amplifies the difference in the levels of voltage developed at the shared data lines SDL, /SDL in response to a sense amplifier enable signal PSA1, shifted during the first clock cycle of the external clock XCLK. The block sense amplifier 140 then outputs that amplified difference as the cell data indicating the information stored in the selected memory cell. The first data register 150 latches the cell data output from the block sense amplifier 140, and outputs the latched cell data to the main data lines MDL, /MDL in response to the second clock PSA2, shifted during the second clock cycle.

The output buffer 160 is connected with the main data lines MDL, /MDL to buffer and output an output level of the cell data to output terminals DataA, /DataA. The second data register 170 latches the data on the output terminals DataA, /DataA and outputs the latched data to the output terminals DataC, /DataC in response to the third clock Kdata, transmitted during the third clock cycle. The output driver 180 is connected to terminals DataC, /DataC of the second data register 170 and outputs the data from the second data register 170 as the read output data DQ. The memory cell array 130 is preferably constructed as a set of arrays divided into a plurality of serve blocks. The particular arrangement and structure of the memory cell arrays, however, are not important in the present invention.

As shown in FIG. 4, the first data register 150 is installed between the rear end of the block sense amplifier 140 and the main data lines MDL, /MDL. According to a preferred embodiment of the invention, therefore, an additional data register is installed between the block sense amplifier 140 (and common data lines SDL, /SDL) and the main data lines MDL, /MDL of the conventional two-stage pipeline structure. In other words, an additional pipeline stage is added to the conventional two-stage pipeline structure. Thus, during the first clock cycle of an external clock, the output data of the block sense amplifier is latched to the first data register 150, which is connected to the front end of the output buffer 160. During the second clock cycle, the latched data is latched to the second data register 170, which is connected to the output end of the output buffer 160. During the third clock cycle, the data latched to the second data register 170 is outputted externally through the output driver 180.

Figure 5:
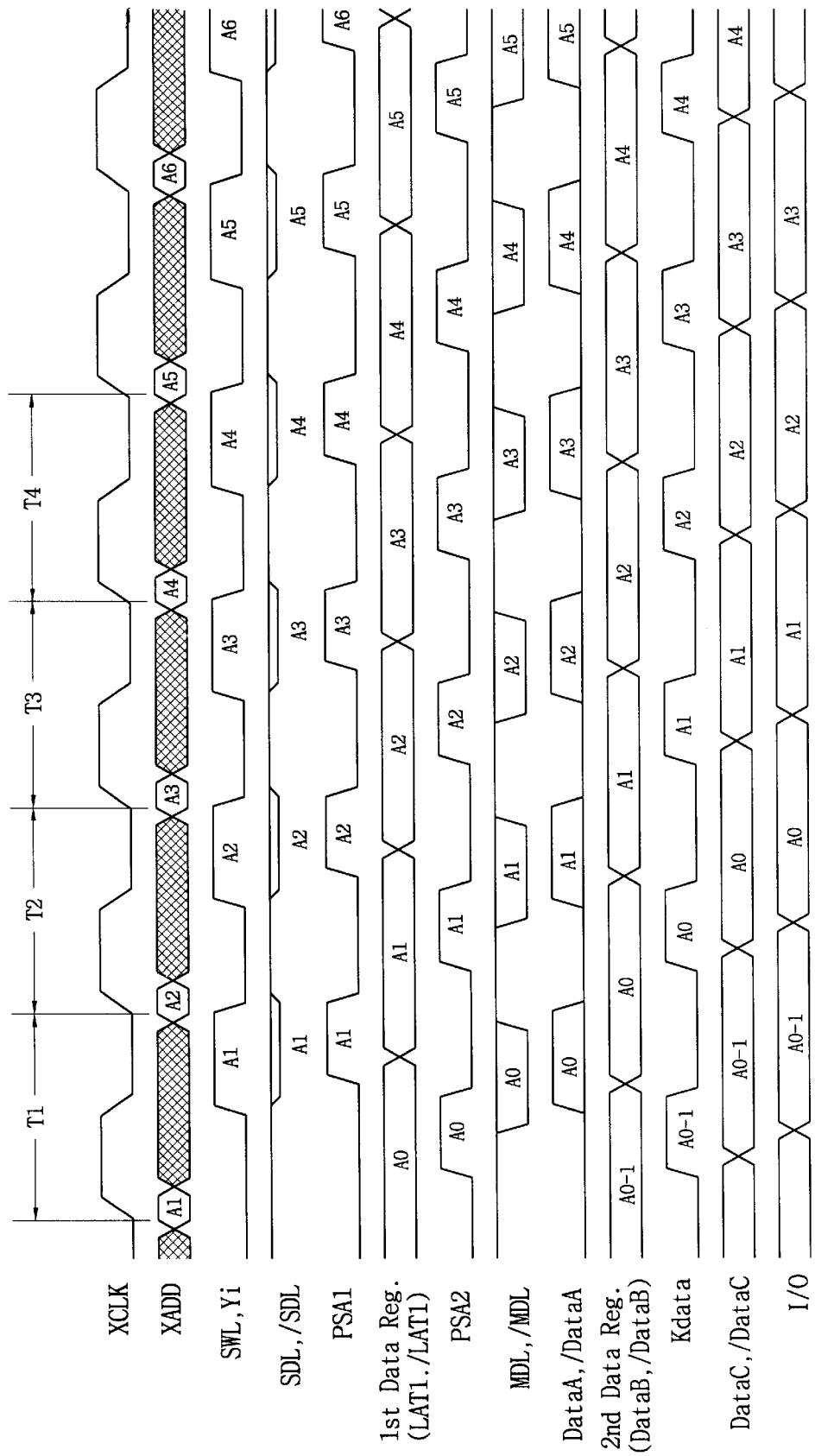
FIG. 5 is a timing diagram of a read operation of the semiconductor device of FIG. 4.

FIG. 5 is a timing flow chart of data read operations in a semiconductor memory constructed in accordance with FIG. 4. In FIG. 5, a horizontal axis indicates time and a vertical axis indicates voltage levels of the various signals. Referring to FIG. 5, an external address XADD is applied to the semiconductor memory. If a first external address A1 is shifted during the first clock cycle T1 of an external clock signal XCLK, the row selecting signal SWL and the column selecting signal Yi are output from the row and column decoders during the first clock cycle T1. Memory cells are selected by enabling the row selecting signal SWL and the column selecting signal Yi, and the charge stored at the selected memory cells develops at the corresponding data lines SDL, /SDL. If the sense amplifier enable signal PSAL is also sent to the block sense amplifier 140 during the first clock cycle T1, the cell data appearing between the data lines SDL, /SDL is latched to the first data register 150. If the second clock PSA2 is shifted during the second clock cycle T2, the latched cell data is output to the main data lines MDL, /MDL.

As shown in FIG. 5, data shown at the main data lines MDL, /MDL is slightly delayed at the output terminals DataA, /DataA of the output buffer 160. The data of the output terminals DataA, /DataA is latched to the second data register 170. The data to be latched by the third clock Kdata is shifted during the third clock cycle T3 and appears at the output terminals DataC, /DataC of the second data register 170. Read output data DQ is pipeline-output by the output driver 180, connected to the output terminals DataC, /DataC through the input/output terminal I/O at the beginning of the third clock cycle T3.

Figure 1:
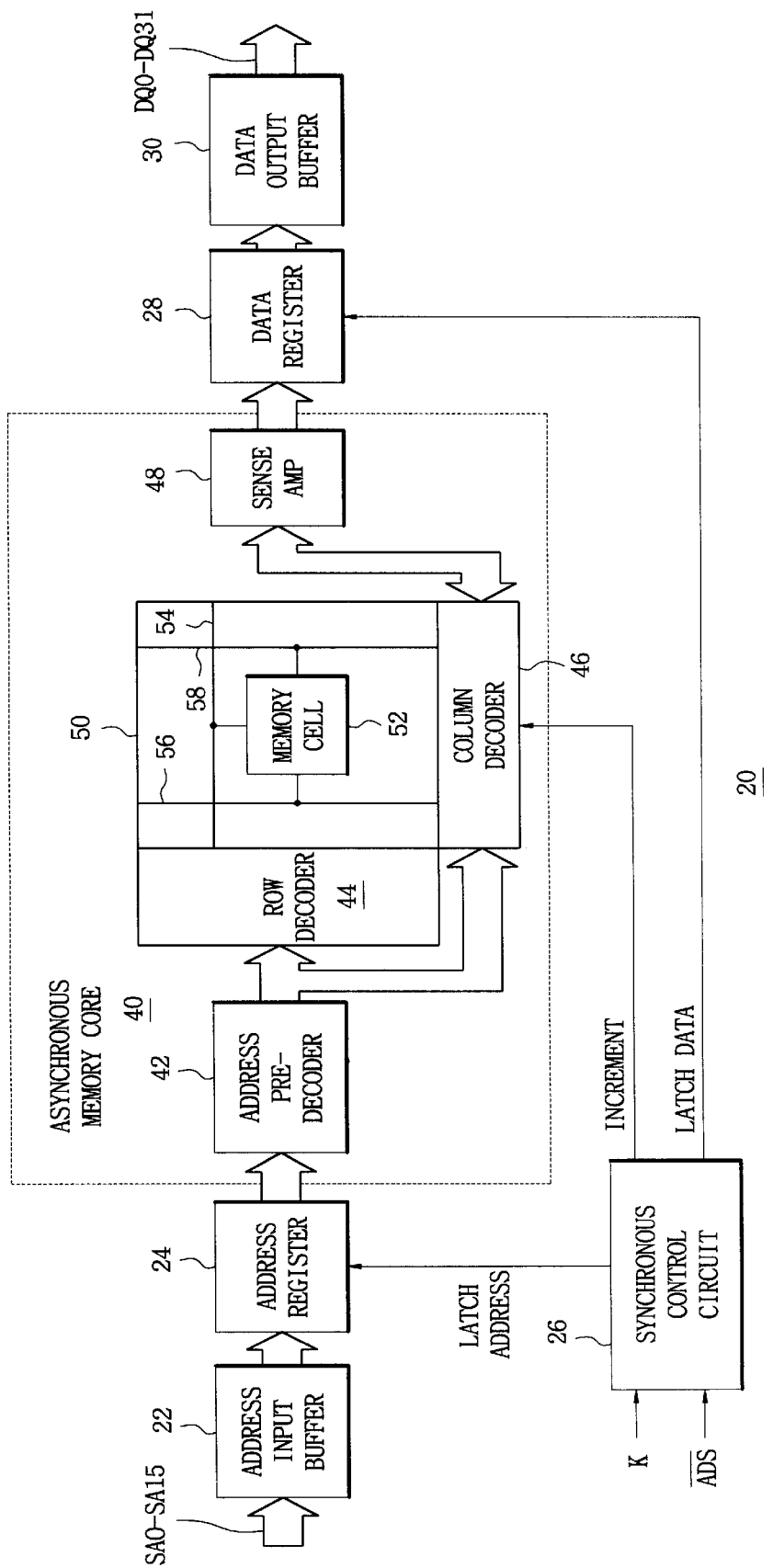
FIG. 1 a block diagram of a synchronous semiconductor memory according to the prior art.
Figure 2:
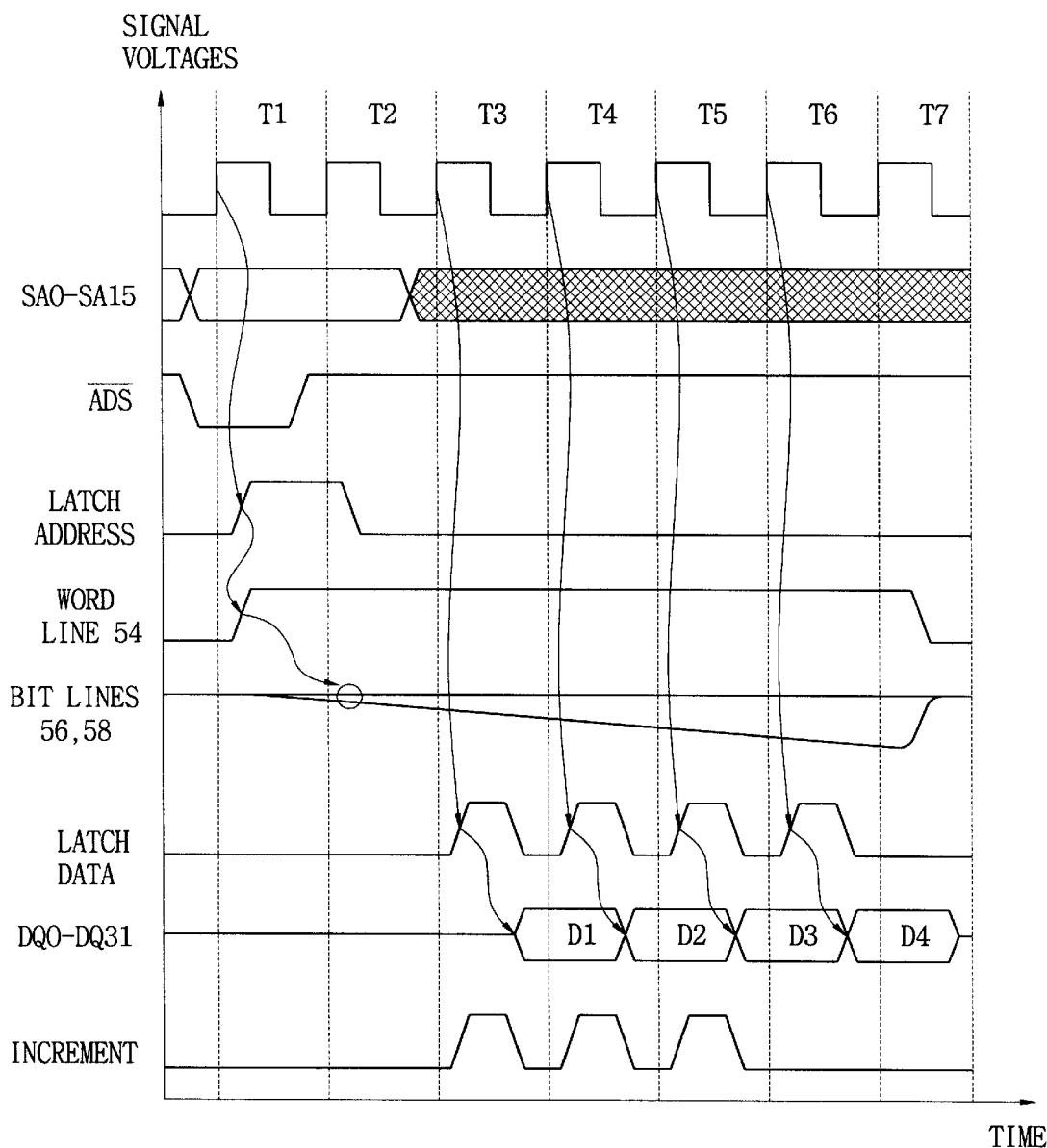
FIG. 2 is a timing diagram illustrating the operation cycle of the synchronous semiconductor memory of FIG. 1.
Figure 3:
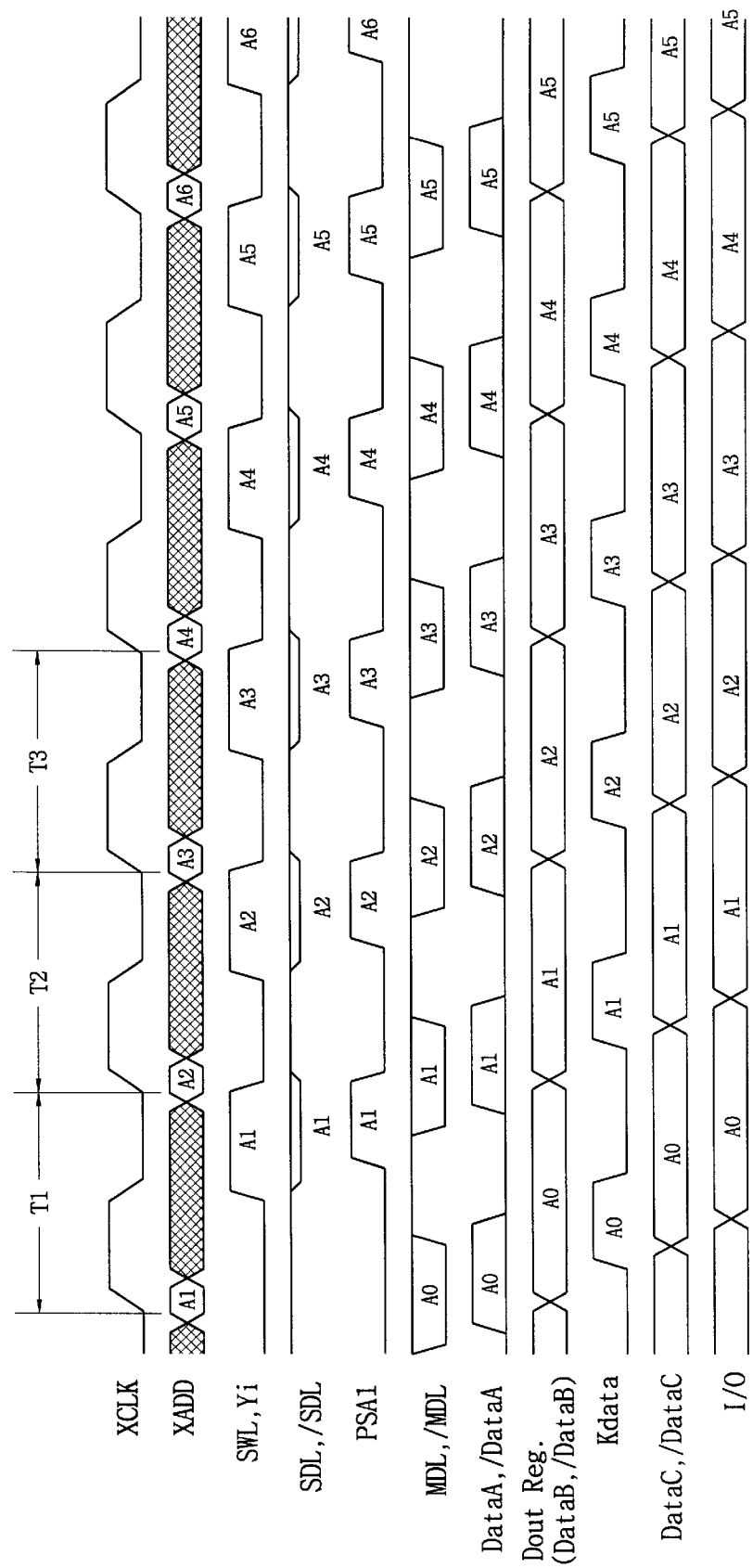
FIG. 3 is a timing diagram illustrating a read operation of a conventional two-stage synchronous semiconductor memory.

As can be seen from the read operations timing chart of FIG. 5, the cycle time according to an embodiment of the present invention is different from that of the prior art cycle time illustrated in FIG. 3. In FIG. 3, the cycle time is determined as the time from the transmission of an external clock signal XCLK to the latching of the output data of the block sense amplifier to the data register 170 (comparable to the second data register in FIG. 4) installed at the rear end of the output buffer. In the embodiment of the present invention whose timing operations are shown in FIG. 5, however, the cycle time is determined as the time that it takes data to be latched to the first data register 150, after transmission of the external clock signal XCLK. Therefore, by comparing these timing charts, it becomes apparent that the cycle time is shorter in the present invention than in the prior art. More particularly, in comparison with the prior art, the addition of a one-stage pipeline to the conventional two-stage pipeline structure makes it possible to shorten the time that it takes the data output from the sense amplifier to reach the main data lines MDL, /MDL. It is also possible to shorten the time to reach the second data register 170 through the output buffer 160 from the main data lines MDL, /MDL.

Figure 6:
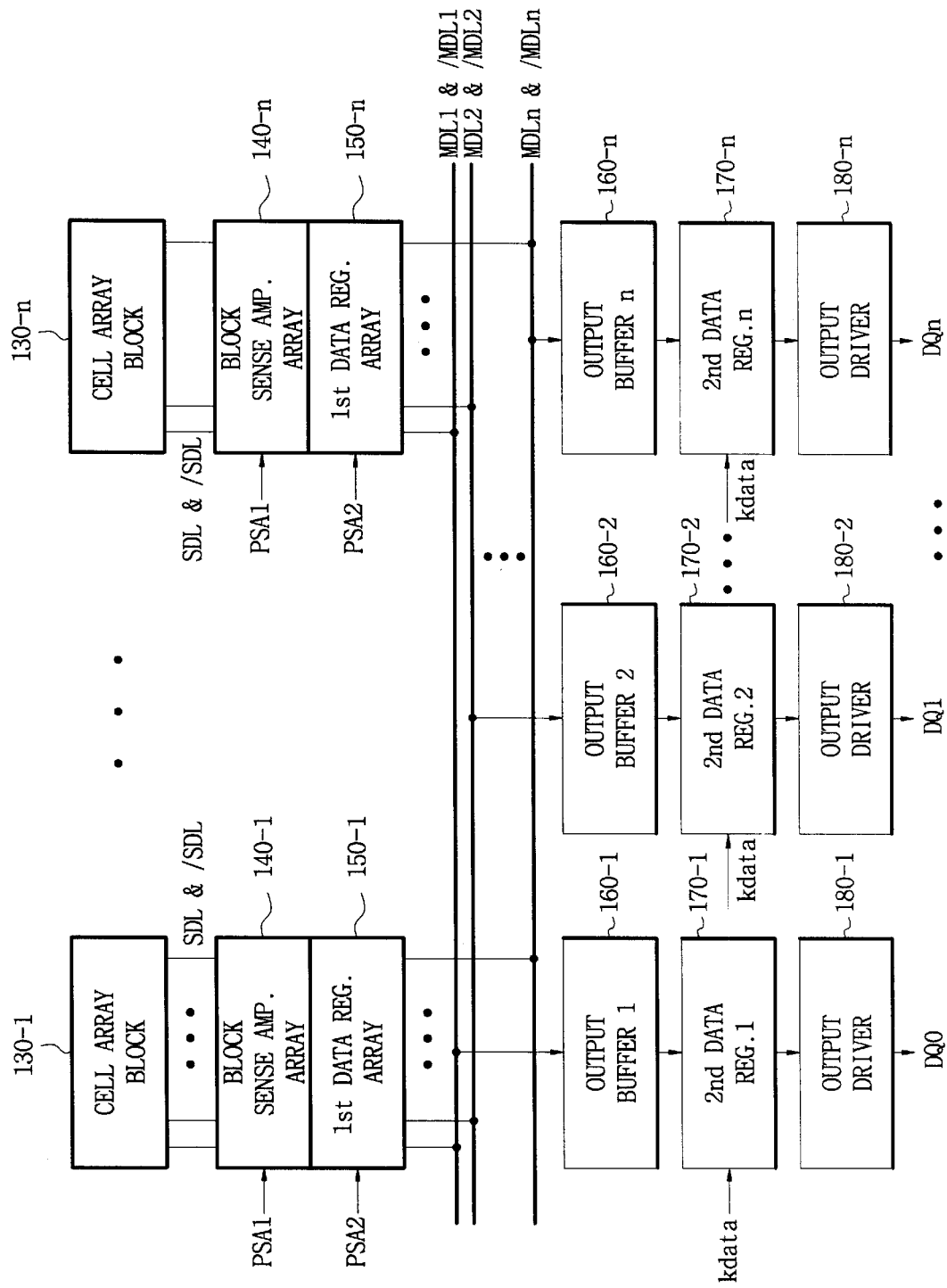
FIG. 6 is a block diagram further illustrating the construction of the semiconductor memory of FIG. 4.

FIG. 6 is a block circuit diagram illustrating part of the semiconductor memory of FIG. 4. Referring to FIG. 6, a semiconductor memory according to an embodiment of this invention includes a memory cell array block 130 connected to an output driver 180 through a block sense amplifier array 140. A first data register array 150 is arranged at the output of the block sense amplifier and outputs data to an output buffer 160. A second data register array 170 receives data from the output buffer 160.

If, as shown, the memory cell array 130 is constructed having a plurality of cell array blocks 130-1, ..., 130-n, then the block sense amplifier 140 is also constructed with a plurality of corresponding block sense amplifier arrays 140-1, ..., 140-n. Similarly, the first data register 150 comprises a plurality of first data register arrays 150-1, ..., 150-n. The first data register arrays 150-1, ..., 150-n are placed at the front end of a plurality of main data lines MDL1 & /MDL1, MDL2 & /MDL2, ..., MDLn & /MDLn. Each of a plurality of output buffers 160-1,160-2, ..., 160-n, of the output buffer 160, is connected to a corresponding pair of the main data lines MDL1 & /MDL1, MDL2 & /MDL2, ..., or MDLn & /MDLn. The second data register 170 is constructed having a plurality of second data register arrays 170-1,170-2, ..., 170-n, which are each connected at the front end a corresponding one of a plurality of output drivers 180-1,180-2, ..., 180-n of the output driver 180.

Referring to FIGS. 5 and 6, according to this embodiment of the invention, a one-stage pipeline structure is added to the prior art two-stage pipeline structure. Constructed in this manner, the first data register arrays 150-1, ..., 150-n respond to the second clocks PSA2, inputted during the second clock cycle T2. The second data register arrays 170-1, ..., 170-n respond to the third clock Kdata, inputted during the third clock cycle T3.

Figure 7:
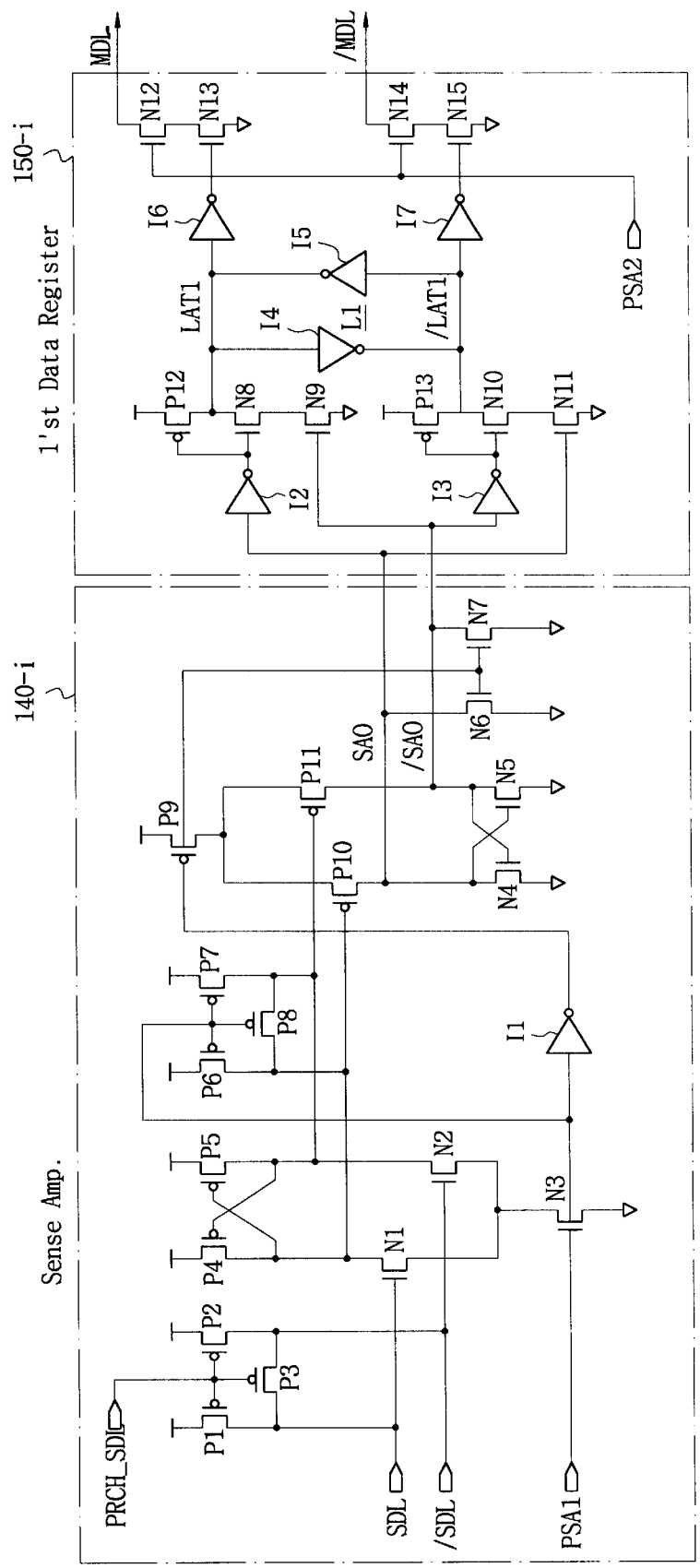
FIG. 7 is a schematic circuit diagram illustrating the construction of a block sense amplifier and a first data register shown in block form in FIG. 6.
Figure 8:
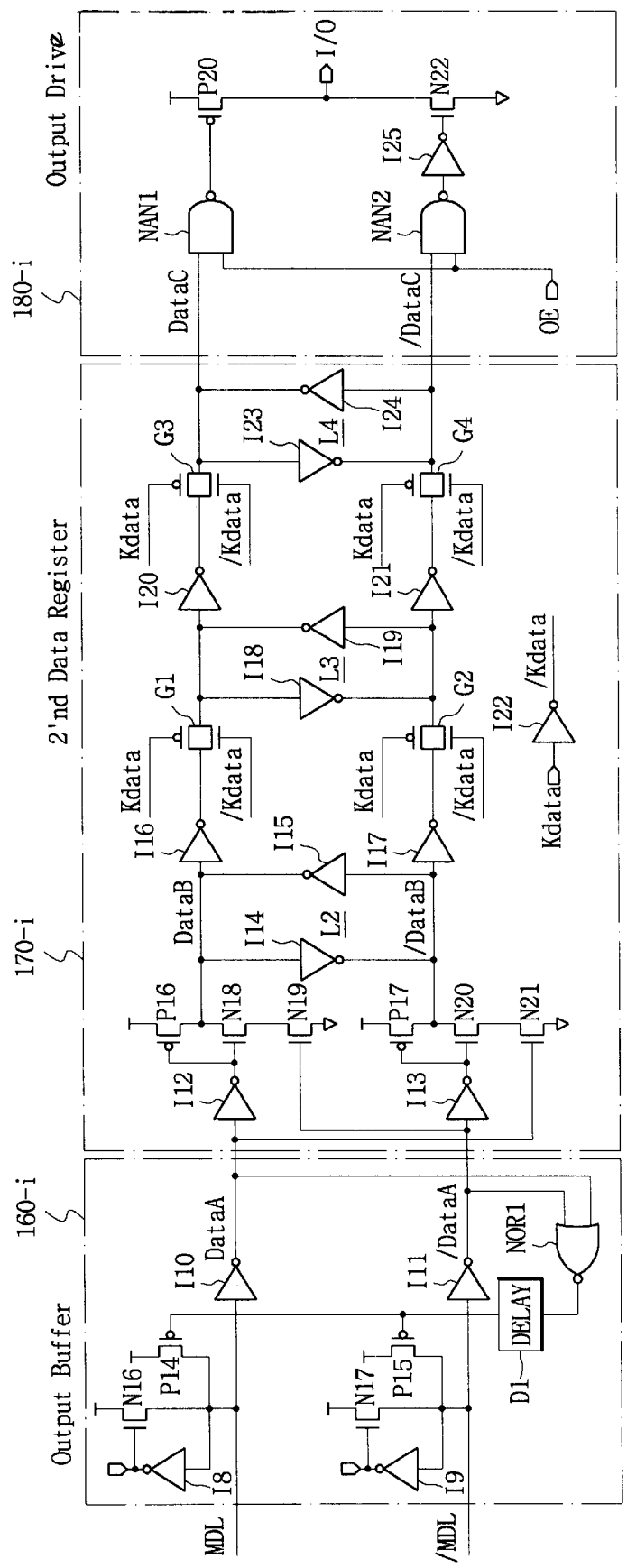
FIG. 8 is a schematic circuit diagram illustrating a data output buffer, a second data register, and an output driver of the semiconductor memory shown in block form in FIGS. 4 and 6.

FIG. 7 is a schematic circuit diagram illustrating the internal construction of the block sense amplifier 140-i and the first data register 150-i of the semiconductor memory of FIG. 6. FIG. 8 is a schematic circuit diagram illustrating the internal construction of the data output buffer 160-i, the second data register 170-i, and the output driver 180-i of the semiconductor memory of FIG. 6. Referring to FIG. 7, the block sense amplifier 140-i is constructed with a plurality of p-channel type MOS (PMOS) transistors P1–P11, a plurality of n-channel type MOS (NMOS) transistors N1–N7, and a CMOS inverter 11.

The first, second, and third PMOS transistors P1, P2, P3 have gate terminals arranged to receive a pre-charge signal PRECH_SDL to pre-charge the data lines SDL, /SDL. The first and second NMOS transistors N1, N2 have gate terminals respectively connected to the fourth and fifth PMOS transistors P4, P5 and to the data lines SDL, /SDL. A third NMOS transistor N3, which responds to a sense amplifier enable signal PSA1, acts as the first sense amplifier to amplify the difference of voltage that develops between the pre-charged data lines SDL, /SDL during the data read operations. The sixth, seventh, and eighth PMOS transistors P6, P7, P8 each have gate terminals arranged to receive the sense amplifier enable signal PSAL and operate to pre-charge the output terminal of the first sense amplifier when the first sense amplifier is in operation.

The ninth PMOS transistor P9 is part of the second sense amplifier and has a gate terminal arranged to receive the sense amplifier enable signal PSA1 through the inverter 11. The sixth and seventh NMOS transistors N6, N7 include drain terminals respectively connected to the output terminals SAO, /SAO of the second sense amplifier. These transistors N6, N7 operate to fix the output terminals SAO, /SAO of the second sense amplifier at a ground voltage level (0V) when the second sense amplifier is in operation.

The first data register 150-i is constructed with six additional inverters 12–17, two additional PMOS transistors P12, P13, and eight additional NMOS transistors N8 –N15. The inputs and outputs of the fourth and fifth inverters 14, 15 are connected together, thereby forming an inverter latch L1. The second inverter 12, twelfth PMOS transistor P12, and eighth and ninth NMOS transistors N8, N9 are interconnected to form a self-latch driving circuit. This self-latch driving circuit acts to self-latch the data appearing at the first output terminal SAO of the second sense amplifier to a latch terminal LAT1 without requiring an external control signal. A third inverter 13, a thirteenth PMOS transistor, and tenth and eleventh NMOS transistors N10, N11 similarly act as a self-latch driving circuit to self-latch the data appearing at the second output terminal /SAO of the second sense amplifier to a complementary latch terminal /LAT1.

A twelfth NMOS transistor N12 has a gate terminal arranged to receive the second clock PSA2 and a drain terminal connected to the main data line MDL. A thirteenth NMOS transistor N13 has a drain terminal connected to a source terminal of the twelfth NMOS transistor N12 and a gate terminal connected to an output terminal of the sixth inverter 16. The input terminal of the sixth inverter 16 is connected to the latch terminal LAT1. This circuit acts as an intermediate driving circuit to transmit the latched data to the rear of the first data register in response to the second clock PSA2. Similarly, the fourteenth and fifteenth NMOS transistors N14, N15 also operate as an intermediate driving circuit. Using these two circuits, the main data lines MDL, /MDL are pre-charged to a high level of voltage (i.e., a supply voltage level) before the second clock PSA2 is enabled to a high level.

Referring now to FIG. 8, the output buffer 160-i buffers and outputs input data from the main data lines MDL, /MDL. The output buffer 160-i has four additional inverters 18, 19, 110, 111, two additional PMOS transistors P14, P15, two additional NMOS transistors N16, N17, a delay unit D1, and a NOR gate NOR1. The eighth inverter 18, sixteenth NMOS transistor N16, and fourteenth PMOS transistor P14 are arranged to pre-charge the main data line MDL to a high level in response to an output of the NOR gate NOR1 transmitted through the delay unit D1. Likewise, the ninth inverter 19, seventeenth NMOS transistor N17, and fifteenth PMOS transistor P15 are arranged to pre-charge the main data line /MDL to a high level in response to an output of the NOR gate NOR1 transmitted through the delay unit D1.

The second data register 170-i is connected to the output terminals DataA, /DataA of the output buffer 160. The second data register 170-i has three additional inverter latches L2, L3, L4, as well as inverters acting as a self-latch driving circuit, two more PMOS transistors P16, P17, four additional NMOS transistors N18–N21, first gates G1, G2, and second gates G3, G4. The third clock Kdata and the complementary third clock /Kdata are transmitted during the third clock cycle T3 as path signals of the first and second transmission gates G1, G2 and G3, G4, respectively.

The output driver 180-i is connected to the output terminals DataC, /DataC of the second data register 170-i and comprises two NAND gates NAN1, NAN2. Each of the NAND gates NAN1, NAN2 has two input terminals. One input terminal of each NAND gate NAN1, NAN2 is connected to a corresponding one of the output terminals DataC, /DataC, respectively. The other terminal of each of the NAND gates NAN1, NAN2 receives an output enable signal OE.

An inverter 125 is connected to the output terminal of the second NAND gate NAN2. A driving PMOS transistor P20 has its gate terminal connected to an output of the first NAND gate NAN1 and its source terminal connected to receive a supply voltage. A driving NMOS transistor N22 has a gate terminal connected to an output terminal of the inverter 125 and a drain-source channel connected between a drain terminal of the driving PMOS transistor P20 and ground. A node connecting the drain terminals of the driving PMOS and NMOS transistors P20, N22 forms an input/output terminal (I/O).

A general description of the operation of an embodiment of the present invention has been made with reference to FIG. 5. The flow of data paths through the preferred embodiment during a read operation will now be described in further detail with reference to FIGS. 7 and 8. As shown in FIG. 7, when a sense amplifier enable signal PSAL for reading operations is shifted to a "high" level, the third NMOS transistor N3 turns on so that the first sense amplifier (consisting of fourth and fifth PMOS transistors P4, P5 and first and second NMOS transistors NI, N2) begins a sensing and amplifying operation. Accordingly, the difference in the level of voltage that develops between the data lines SDL, /SDL is amplified.

While the sense amplifier enable signal PSAL is shifted to a high level, the first inverter 11 outputs a "low" level. This causes the sixth and seventh NMOS transistors N6, N7 to turn off to cease pre-charging the output terminals SAO, /SAO. At the same time, the ninth PMOS transistor P9 is turned on. As a result, the second sense amplifier (consisting of ninth, tenth, and eleventh PMOS transistors P9, P10, P11 and fourth and fifth NMOS transistors N4, N5) begins its operations.

After the charge stored in the selected memory cells is shared by the corresponding data lines, and provided that the level of voltage is higher than or almost the same as the pre-charged voltage level at the data lines SDL, /SDL, the first NMOS transistor N1 of the first sense amplifier is turned on more strongly than the second NMOS transistor N2. This is because the fifth PMOS transistor P5, arranged in a current path with the second NMOS transistor N2, is turned on more strongly than the fourth PMOS transistor P4. As time elapses, the fourth PMOS transistor P4, whose gate is connected to the drain of the fifth PMOS transistor P5, is turned off. As a result, the tenth PMOS transistor P10 of the second sense amplifier is turned on more strongly than the eleventh PMOS transistor P11. The output terminals SAO, /SAO of the second sense amplifier transition to their high and low levels of voltage, respectively, by the processes of sensing and amplifying levels of voltage.

The memory cell data appearing as high and low levels of voltage at the output terminals SAO, /SAO are self-latched to an inverter latch L1 of the first data register 150-i. The self-latching operations will now be described in detail. The high level of voltage appearing at the output terminal SAO is inverted to a low level to turn on the twelfth PMOS transistor P12 and to turn off the eighth NMOS transistor N8. At this time, the ninth NMOS transistor N9 is turned off by receiving a low level of voltage from the output terminal /SAO. As a result, a high level of voltage appears at the latch terminal LAT1. The tenth NMOS transistor N10, on the other hand, is turned on by a high level of voltage received through the third inverter 13 and the eleventh NMOS transistor N11 is turned on by the high level of the voltage appearing at the output terminal SAO. The thirteenth PMOS transistor P13 is turned off by the low level of voltage appearing at the complementary latch terminal /LAT1.

The first self-latch driving circuit (including the second inverter 12, twelfth PMOS transistor P12, eighth and ninth NMOS transistors N8, N9) and the second self-latch driving circuit (including the third inverter 13, thirteenth PMOS transistor P13, and tenth and eleventh NMOS transistors N10, N11) cause the latch terminal LAT1 and the complementary terminal /LAT1 to transition to the high and low levels, respectively. The high level of the latch terminal LAT1 and the low level of the complementary latch terminal /LAT1 are latched by an inverter latch having fourth and fifth inverters 14 and 15, so as to be respectively inverted by the sixth and seventh inverters 16,17 to the low and high levels.

While the main data lines MDL, /MDL are being pre-charged, the twelfth and fourteenth NMOS transistors N12, N14 of the intermediary driving circuit are turned on by a high level of the second clock PSA2. The thirteenth NMOS transistor N13, however, receives a low level voltage from the sixth inverter 16 at its gate terminal and is therefore in its off state. The fifteenth NMOS transistor N15, on the other hand, receives a high level signal from the seventh inverter 17 at its gate terminal and is therefore turned on. Accordingly, the main data line MDL does not form a current path to the ground, but rather maintains itself at its high level. The current in the complementary main data line /MDL, however, flows to the ground, thereby retaining it at a low level. Finally, the high and low levels latched by the intermediary driving circuit at the latch terminal LAT1 and the complementary latch terminal /LAT1 are transmitted to the output buffer 160-i at the rear end in synchronization with the second clock PSA2, shifted during the second cycle of the external clock signal XCLK.

The high and low levels on the main data lines MDL, /MDL are then buffered in the output buffer 160-i, shown in FIG. 8, to be low and high output data from its output terminals DataA, /DataA. The low and high levels of the output data are then self-latched at the latch terminal DataB and the complementary latch terminal /DataB, respectively, of the first inverter latch L2 of the second data register 170-i. The low and high levels are inverted by the sixteenth and seventeenth inverters 116, 117 and then shifted to the input terminal of the corresponding first transmission gate GI or G2. The high and low levels that respectively pass the first transmission gates GI, G2 are latched to the second inverter latch L3 of the second data register 170-i to be low and high levels, respectively, at the output terminals of the twentieth and twenty-first inverters 120,121. The second transmission gates G3, G4 respectively transmit the low and high levels according to the third clock Kdata and the third complementary clock /Kdata, shifted during the third clock cycle T3 of the external clock XCLK. The low and high levels are latched to the third inverter latch L4 of the second data register 170-$i$, thereby appearing at the output terminals DataC, /DataC thereof.

The output driver 180-$i$ is connected to the output terminals DataC, /DataC of the second data register 170-$i$. The first NAND gate NAN1 of the output driver 180-$i$ receives the data appearing at output terminal DataC of the second data register 170-$i$ and an output enable signal OE. The first NAND gate NAN1 thereby outputs a high level. The second NAND gate NAN2 receives data from the complementary output terminal /DataC and the output enable signal OE. The second NAND gate NAN2 thereby outputs a low level. The output enable signal OE is provided at its high level at the time of an enabling step. As a result, the driving PMOS transistor P20 is turned off, but because the output of the twenty-fifth inverter 125 is at its high level, the driving NMOS transistor N22 is turned on. Accordingly, a low level output showing the stored information of the selected memory cells is outputted from the final input/output terminal I/O. In this manner, data starts to be continuously output to the input/output terminal I/O after the third cycle of the external clock.

In constructing a multi-stage pipeline according to the principles of this invention, a determination should be made as to where to place the additional pipeline stage or stages (e.g., where the first data register will be added). If the first data register is added to the decoder terminal, for instance, it may be difficult to reduce the cycle time because of the delay for data to be latched from the decoder terminal to the data register at a subsequent cycle of the external clock signal. If the first data register is positioned at the output buffer terminal output, as is the data register of the prior art, it is also difficult to reduce the cycle time because the cycle time is then determined as it was in the prior art.

Thus, in the preferred embodiment of the present invention described above, the first data register is connected to the output of the first sense amplifier positioned closest to the memory cells. If the prior art two-stage pipeline method is applied to a 4 mega-bit synchronous pipeline SRAM, an output speed of 275 MHz (tCYC=3.7 ns) results. In comparison, by using the preferred embodiment of the present invention an output speed of 400MHz (tCYC=2.5 ns) is obtained, representing a significant reduction in the cycle time.

In summary, according to the preferred embodiment of this invention, an additional data register is installed between the block sense cell data amplifier and main data lines MDL, /MDL in a general synchronous semiconductor memory. In other words, an additional one-stage pipeline is added to the conventional two-stage pipeline structure to reduce the cycle time of the memory. The cycle time tCYC according to this embodiment is determined not by the time that takes data to be latched to the data register connected to the rear end of the output buffer, but rather by the time that it takes data to be latched to the first data register following an external clock, where the first data register immediately follows the sense amplifier. According to this configuration and method, it is possible to significantly reduce the cycle time of the memory.

As described above, a synchronous pipeline semiconductor memory having an appropriately arranged pipeline structure with more than two stages is able to reduce a cycle time of the memory. More specifically, a three or more-stage pipeline is able to significantly reduce the time required for latching data and is therefore advantageous for a high-speed synchronous semiconductor memory.

While the circuits shown and described above represent a preferred embodiment of the present invention, a variety of modifications may be applied to them. Accordingly, while the invention has been described in terms of a preferred embodiment, those skilled in the art will recognize that the features of the preferred embodiment can be modified in arrangement and detail without departing from such teachings. Among other things, the circuit components of the data registers can be replaced with other circuit elements. The invention should be therefore be interpreted to cover all aspects and embodiments falling within the spirit and scope of the appended claims.

What is claimed is:

1. A semiconductor memory having a multi-stage pipeline configuration, comprising:
   a two-stage pipeline configuration comprising a memory cell array, a sense amplifier, and a data register; and
   an additional data register arranged between the sense amplifier and a common data line, wherein the additional data register comprises a self-latch driving circuit.

2. A memory according to claim 1, wherein the additional data register further comprises an inverter latch connected to an output of the self-latch driving circuit.

3. A memory according to claim 1, wherein the additional data register further comprises an intermediary driving circuit connected to an output of the inverter latch.

4. A memory according to claim 1, wherein an output terminal of the additional data register is connected with the common data line, and wherein the common data line is configured to be pre-charged to a high level.

5. A memory according to claim 1, wherein said additional data register is configured to latch a data output from the sense amplifier and to output the latched data in response to a second clock.

6. A memory according to claim 1, wherein the data register is configured to latch the data output from the additional data register and to output the latched data in response to a third clock; and wherein an output driver is configured to receive the latched data output from the data register and to externally output said latched data.

7. A memory according to claim 6, wherein the data register comprises an internal three-stage latch and a two-stage transmission gate.

8. A synchronous pipeline semiconductor memory comprising:
   a memory cell array comprising a plurality of memory cells;
   a clock buffer configured to receive an external clock signal and to generate a first clock, a second clock, and a third clock;
   an input buffer configured to receive an external address in response to the first clock and to output the address;
   a decoder configured to decode the address output from the input buffer into corresponding row and column selection signals and to output the row and column selection signals to the memory cell array to select a memory cell;
   a sense amplifier configured to sense and amplify data from the selected memory cell in response to a sense amplifier enable signal and to output the amplified data;
   a first data register configured to store the amplified data output from the sense amplifier, wherein the first data register comprises a self-latching driving circuit;

an intermediary driving circuit configured to provide the data stored in the first data register to a main data line in response to the second clock;

an output buffer configured to buffer and output the data on the main data line; and a second data register configured to store the data output from the output buffer and to provide the stored data to an output driver in response to the third clock.

9. A memory according to claim 8, wherein the first data register further comprises an inverter latch connected with an output of the self-latching driving circuit.

10. A memory according to claim 8, wherein the main data line is connected to an output terminal of the intermediary driving circuit and is configured to be pre-charged to a high level.

11. A memory according to claim 8, wherein the second data register has an internal three-stage latch and a two-stage transmission gate.

12. A method of operating a synchronous semiconductor memory comprising:

latching output data from a block sense amplifier to a first data register connected to a front end of an output buffer during a first clock cycle by self latching the output data in a self-latching circuit of the first data register;

latching the latched data to a second data register connected to a rear end of the output buffer during a second clock cycle; and externally outputting the latched data stored at the second data register through an output driver during a third clock cycle.

13. A method according to claim 12, further comprising:

sensing and amplifying data from a memory cell selected according to an external address signal to produce the output data of the block sense amplifier; and arranging the first data register to receive the output data from an output terminal of the block sense amplifier.

14. A method according to claim 12, wherein the latched data from the first data register is provided to a main data line.

15. A method according to claim 14, wherein a clock cycle is measured from an external clock input to a time when data is latched to the main data line from the first data register.

16. A method according to claim 12, wherein latching the latched data to a second data register comprises self latching the latched data in a self-latching circuit of the second data register.

17. A synchronous pipeline semiconductor memory comprising:

a memory cell array comprising a plurality of memory cells;

a block sense amplifier for sensing and amplifying data of a memory cell selected in response to a sense amplifier enable signal, the sense amplifier enable signal being shifted during a first clock cycle of an external clock;

a first data register for self-latching data output from the block sense amplifier and for outputting the latched data in response to a second clock, said second clock being shifted during a second clock cycle of the external clock;

a second data register configured to latch the data output from the first data register and to output the latched data in response to a third clock, said third clock being shifted during a third clock cycle of the external clock; and an output driver configured to receive the latched data output from the second data register and to externally output said latched data.

18. A memory according to claim 17, wherein the first data register comprises a self-latching driving circuit and an inverter latch, said inverter latch being coupled to an output of the self-latch driving circuit.

19. A synchronous pipeline semiconductor memory comprising:

a memory cell array comprising a plurality of memory cells;

a block sense amplifier configured to sense and amplify data of the memory cells selected in response to a sense amplifier enable signal, said sense amplifier enable signal being shifted during a first clock cycle of an external clock;

a first data register connected to an output of the block sense amplifier, said first data register configured to self-latch the data output from the block sense amplifier and to output the latched data to a main data line in response to a second clock, said second clock being shifted during a second clock cycle;

an output buffer arranged to receive and transmit the latched data output from the main data line; and a second data register connected between the output buffer and an output driver and configured to receive the latched data from the output buffer and to latch and output the latched data to the output driver in response to a third clock, said third clock being shifted during a third clock cycle.

20. A memory according to claim 19, wherein a cycle time is determined by the time it takes the latched data output to appear on the main data line from the input of the external clock signal.

* * * * *

UNITED STATES PATENT AND TRADEMARK OFFICE
CERTIFICATE OF CORRECTION

PATENT NO. : 6,490,206 B2
APPLICATION NO. : 09/957821
DATED : December 3, 2002
INVENTOR(S) : Kwon et al.

It is certified that error appears in the above-identified patent and that said Letters Patent is hereby corrected as shown below:

Column 2, line 15, "PSAL" should read --PSA1--;

Column 4, line 48, "PSAL" should read --PSA1--;

Column 5, line 65, "inverter 11" should read --inverter I1--;

Column 6, line 11, "PSAL" should read --PSA1--;

Column 6, line 15, "inverter 11" should read --inverter I1--;

Column 6, line 23, "inverters 12-17" should read --inverters I2-I7--;

Column 6, line 26, "inverters 14, 15" should read --inverters I4, I5--;

Column 6, line 27, "inverter 12," should read --inverter I2,--;

Column 6, line 33, "inverter 13" should read --inverter I3--;

Column 6, line 44, "inverter 16." should read --inverter I6.--;

Column 6, line 44, "sixth inverter 16" should read --sixth inverter I6--;

Column 6, line 57, "18, 19, 110, 110," should read --I8, I9, I10, I11,--;

Column 6, line 59, "inverter 18" should read -- inverter I8--;

Column 6, line 66, "inverter 19" should read -- inverter I9--;

Column 7, line 20, "inverter 125" should read -- inverter I25--;

Column 7, line 26, "inverter 125" should read -- inverter I25--;

Column 7, line 40, "transistors NI" should read --transistors N1--;

Column 7, line 46, "inverter 11" should read --inverter I1--;

Column 8, line 16, "inverter 13," should read -- inverter I3,--;

Column 8, line 22, "inverter 12," should read -- inverter I2,--;

UNITED STATES PATENT AND TRADEMARK OFFICE
CERTIFICATE OF CORRECTION

PATENT NO. : 6,490,206 B2
APPLICATION NO. : 09/957821
DATED : December 3, 2002
INVENTOR(S) : Kwon et al.

It is certified that error appears in the above-identified patent and that said Letters Patent is hereby corrected as shown below:

Column 8, line 23, "inverter 13," should read -- inverter I3,--;

Column 8, line 31, "inverters 14 and 15," should read -- inverters I4 and I5,--;

Column 8, line 32, "inverters 16,17" should read -- inverters I6, I7--;

Column 8, line 38, "inverter 16" should read -- inverter I6--;

Column 8, line 41, "inverter 17" should read --inverter I7--;

Column 8, line 60, "inverters 116, 117" should read --inverters I16, I17--

Column 8, line 66, "inverters 120, 121." should read --inverters I20, I21--;

Column 8, line 61, "gate GI or" should read --gate G1 or--;

Column 8, line 63, "gates GI, G2" should read --gates G1, G2--;

Column 9, line 19, "inverter 125" should read --inverter I25--;

Column 10, line 42, "from the data" should read --from the second data--.

Signed and Sealed this

Eighteenth Day of September, 2007

JON W. DUDAS
*Director of the United States Patent and Trademark Office*